(12) United States Patent
Sung

(10) Patent No.: US 8,157,914 B1
(45) Date of Patent: Apr. 17, 2012

(54) SUBSTRATE SURFACE MODIFICATIONS FOR COMPOSITIONAL GRADATION OF CRYSTALLINE MATERIALS AND ASSOCIATED PRODUCTS

(76) Inventor: Chien-Min Sung, Taipei County (TW)

( * ) Notice: Subject to any disclaimer, the term of this patent is extended or adjusted under 35 U.S.C. 154(b) by 378 days.

(21) Appl. No.: 11/809,718

(22) Filed: May 31, 2007

Related U.S. Application Data

(60) Provisional application No. 60/900,292, filed on Feb. 7, 2007.

(51) Int. Cl.
*C30B 21/02* (2006.01)

(52) U.S. Cl. .............................. 117/81; 117/83; 438/34

(58) Field of Classification Search ............... 117/81, 117/83; 257/E21.222; 438/34
See application file for complete search history.

(56) References Cited

U.S. PATENT DOCUMENTS

| | | | |
|---|---|---|---|
| 959,054 A | 5/1910 | Glover | |
| 4,012,242 A | 3/1977 | Matare | |
| 4,390,379 A | 6/1983 | Lien | |
| 4,604,106 A | 8/1986 | Hall | |
| 4,751,099 A | 6/1988 | Niino et al. | |
| 4,830,615 A | 5/1989 | Goldstein et al. | |
| 4,912,063 A | 3/1990 | Davis | |
| 4,912,064 A | 3/1990 | Kong | |
| 4,981,818 A | 1/1991 | Anthony et al. | |
| 5,219,632 A | 6/1993 | Shimakura et al. | |
| 5,252,173 A | 10/1993 | Inoue | |
| 5,281,299 A | 1/1994 | Escoffier et al. | |
| 5,362,523 A | 11/1994 | Gorynin et al. | |
| 5,390,626 A | 2/1995 | Nagasawa et al. | |
| 5,455,000 A | 10/1995 | Seyferth et al. | |
| 5,525,374 A | 6/1996 | Ritland et al. | |
| 5,562,769 A | 10/1996 | Dreifus et al. | |
| 5,645,471 A | 7/1997 | Strecker | |
| 5,656,821 A | 8/1997 | Sakuma | |
| 5,662,965 A | 9/1997 | Deguchi et al. | |
| 5,744,825 A | 4/1998 | Zachai et al. | |
| 5,755,879 A | 5/1998 | Shintani et al. | |
| 5,879,450 A | 3/1999 | Lee et al. | |
| 5,895,706 A | 4/1999 | Yoshinaga | |
| 5,919,305 A | 7/1999 | Solomon | |
| 6,054,719 A | 4/2000 | Fusser et al. | |
| 6,117,750 A | 9/2000 | Bensahel et al. | |

(Continued)

FOREIGN PATENT DOCUMENTS

GB 2 398 672 8/2004

(Continued)

OTHER PUBLICATIONS

Blanchard et al., "New SOI Devices Transferred Onto Fused Silica by Direct Wafer Bonding", Accessed Mar. 29, 2007, pp. 1-6, France.

(Continued)

*Primary Examiner* — Bob M Kunemund
(74) *Attorney, Agent, or Firm* — Thorpe North & Western LLP

(57) ABSTRACT

A compositionally graded material having low defect densities and improved electronic properties is disclosed and described. A compositionally graded inorganic crystalline material can be formed by preparing a crystalline substrate by forming crystallographically oriented pits across an exposed surface of the substrate. A transition region can be deposited on the substrate under substantially epitaxial growth conditions. Single crystal substrates of a wide variety of materials such as diamond, aluminum nitride, silicon carbide, etc. can be formed having relatively low defect rates.

18 Claims, 6 Drawing Sheets

U.S. PATENT DOCUMENTS

| | | |
|---|---|---|
| 6,214,079 B1 | 4/2001 | Kear et al. |
| 6,303,473 B1 | 10/2001 | Heffernan |
| 6,447,604 B1 | 9/2002 | Flynn et al. |
| 6,468,347 B1 | 10/2002 | Motoki et al. |
| 6,488,771 B1 | 12/2002 | Powell et al. |
| 6,537,370 B1 | 3/2003 | Hernandez et al. |
| 6,580,196 B1 | 6/2003 | Shiono et al. |
| 6,616,757 B1 | 9/2003 | Melnik et al. |
| 6,649,287 B2 | 11/2003 | Weeks, Jr. et al. |
| 6,736,894 B2 * | 5/2004 | Kawahara et al. ............... 117/2 |
| 6,794,276 B2 * | 9/2004 | Letertre et al. ............... 438/506 |
| 6,896,728 B2 | 5/2005 | Falster et al. |
| 6,936,851 B2 * | 8/2005 | Wang ............... 257/79 |
| 6,946,788 B2 * | 9/2005 | Suehiro et al. ............... 313/498 |
| 7,071,490 B2 | 7/2006 | Edmond et al. |
| 7,109,521 B2 | 9/2006 | Hallin et al. |
| 7,183,206 B2 * | 2/2007 | Shepard ............... 438/672 |
| 7,230,274 B2 | 6/2007 | O'Loughlin et al. |
| 7,618,880 B1 | 11/2009 | Quick |
| 2002/0014198 A1 | 2/2002 | Kawahara et al. |
| 2002/0096104 A1 * | 7/2002 | Yagi et al. ............... 117/84 |
| 2002/0173234 A1 | 11/2002 | Sung et al. |
| 2004/0018749 A1 | 1/2004 | Dorfman |
| 2005/0074355 A1 | 4/2005 | Pickard et al. |
| 2008/0113496 A1 | 5/2008 | Keller |
| 2008/0251812 A1 * | 10/2008 | Yoo ............... 257/183 |

FOREIGN PATENT DOCUMENTS

| | | |
|---|---|---|
| JP | 60-86089 | 5/1985 |

OTHER PUBLICATIONS

Lindner et al., "Plasma Activated Wafer Bonding for Thin Silicon-On-Insulator Substrate Fabrication", Abstract accessed Mar. 29, 2007, Phoenix AZ & Scharding, Austria.

T.W. Schroeder, et al., Selective Si epitaxial growth technique employing atomic hydrogen and substrate temperature modulation, Applied Physics Letters, Oct. 1, 2001, vol. 79, Issue 14, pp. 2181-2183. Cornell University, Ithaca, New York.

U.S. Appl. No. 11/809,806, filed May 31, 2007, Chien-Min Sung, Office Action Issued Jun. 22, 2010.

U.S. Appl. No. 11/809,806, filed May 31, 2007; Chien-Min Sung; office action issued Nov. 18, 2010.

U.S. Appl. No. 11/809,721, filed May 31, 2007; Chien-Min Sung; office action issued Feb. 11, 2011.

U.S. Appl. No. 11/809,721, filed May 31, 2007; Chien-Min Sung; office action issued Sep. 1, 2011.

U.S. Appl. No. 11/809,806, filed May 31, 2007; Chien-Min Sung; office action issued Jul. 22, 2011.

U.S. Appl. No. 11/809,806, filed May 31, 2007; Chien-Min Sung; final office action issued Mar. 31, 2011.

* cited by examiner

FIG. 1
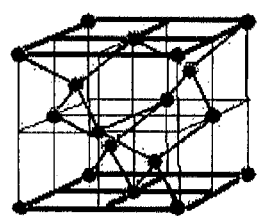
FIG. 2A
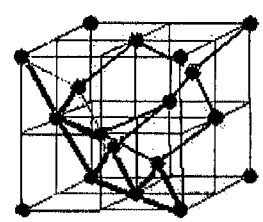
FIG. 2B
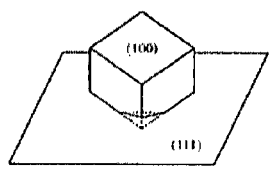
FIG. 2D
FIG. 2F
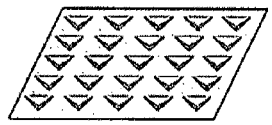
FIG. 2C
FIG. 2E FIG. 2G 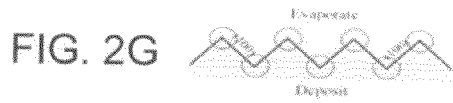  FIG. 2J
FIG. 2H 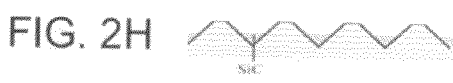  FIG. 2K
FIG. 2I 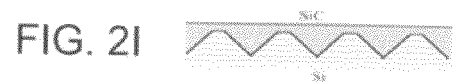 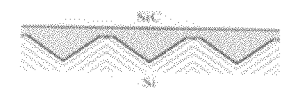 FIG. 2L
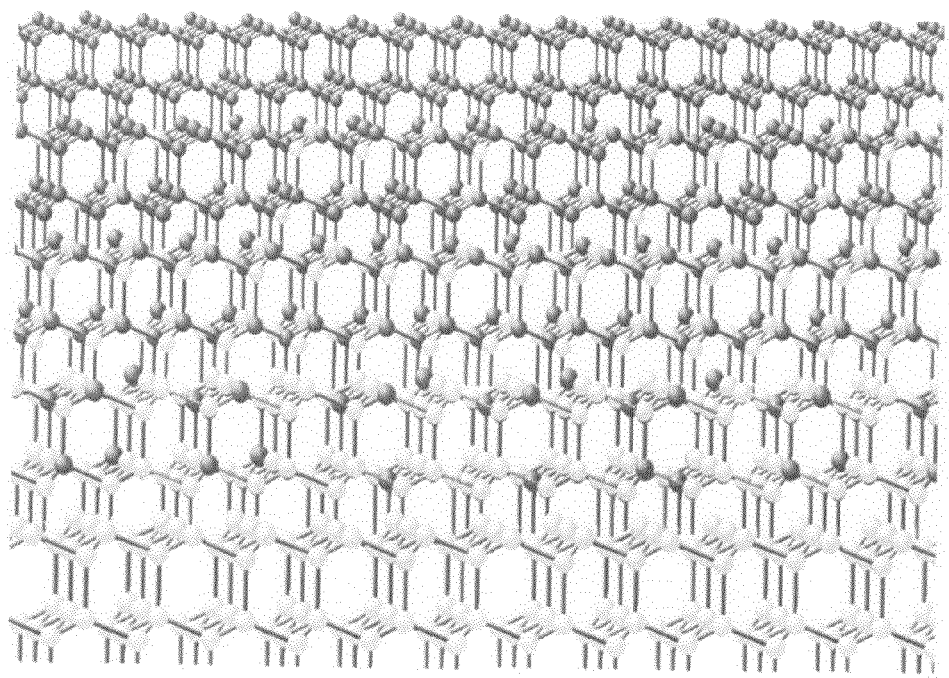
FIG. 3A

US 8,157,914 B1

SUBSTRATE SURFACE MODIFICATIONS FOR COMPOSITIONAL GRADATION OF CRYSTALLINE MATERIALS AND ASSOCIATED PRODUCTS

RELATED APPLICATIONS

This application claims the benefit of U.S. Provisional Application No. 60/900,292, filed Feb. 7, 2007, which is incorporated herein by reference in its entirety.

FIELD OF THE INVENTION

The present invention relates generally to compositionally graded materials for electronic devices and methods of producing such materials. Accordingly, the present invention involves the fields of chemistry, semiconductors and materials science.

BACKGROUND OF THE INVENTION

Compositional gradation of various materials has been extensively studied and practiced in a wide variety of fields. Further, many semiconductor based materials have attempted to use compositional grading in order to provide various benefits such as reduced lattice mismatch stress and other electronic effects related to grading of dopants. For example, LEDs are rapidly replacing lighting lamps on streets (e.g. traffic lights and automobile lights) and in homes, and also displacing CCFLs in illuminating LCD panels for computers and TV screens. Most LEDs are made of GaN crystals that are deposited on a sapphire substrate. There is a large lattice mismatch between these materials that causes high dislocation densities in GaN; however, industry currently has no better substrates. An ideal substrate for GaN would be SiC having a small lattice mismatch. Unfortunately, single crystal SiC (e.g. available from Cree Research) is currently only made by vapor crystallization which is both slow and expensive, e.g. the Lely method, and is typically limited to small wafer sizes, i.e. about 2 inches. In this approach, epitaxial growth of SiC single crystal on a single crystal silicon wafer includes using a common microwave enhanced plasma CVD reactor for depositing diamond and condensing SiC vapor at very high temperatures.

The most commonly available single crystal wafer used today is silicon. However, conventional CVD deposition of SiC on Si tends to form polycrystalline SiC due to spontaneous nucleation across the entire surface of the Si wafer. Silicon carbide on diamond can be formed by CVD depositing diamond film on a silicon wafer and then etching the original silicon wafer off to leave SiC. According to this known process SiC forms prior to diamond formation between the silicon and diamond. However, this method has little utility because of the spontaneous nucleation of either SiC or diamond on the silicon wafer. The simultaneous nucleation not only forms polycrystalline grains with grain boundaries and dislocations, but also with gaps between grains so the SiC film is not continuous.

Moreover, thick SiC wafers are a polytype with significant twinning. Hence, the advantages of SiC wafers are limited well below theoretical pure SiC wafers. For example, SiC can be used as an electrode so a GaN crystal can be symmetric with two electrodes located on opposite sides. However, this advantage disappears because LED typically use flip chips where two electrodes are oriented on the same side. Specifically, LED grown on insulating sapphire is directly bonded to the submount made of silicon which could be formed of diamond film. In such a case, no wires would be needed to connect with the electrodes, so no light will be blocked from LED. However, SiC LEDs have one electrode on the top, as well as the connecting wire. Similar problems of crystal defects (e.g. impurities, dislocations, grain boundaries, etc.), size limitations, and expense are encountered when seeking to form large single crystal substrates for electronic materials using other crystalline materials such as nitrides, diamond and the like.

Although these materials and approaches have exhibited some desirable properties, the resulting materials tend to suffer from high defect rates and poor electronic performance which limits their commercial practicability.

SUMMARY OF THE INVENTION

Accordingly, it has been recognized that improvements in preparing substantially single crystal substrates from a variety of materials would be desirable and provide advancement in the industry. In accordance with one embodiment of the present invention, a method of forming a compositionally graded inorganic crystalline material can include preparing a crystalline substrate. The crystalline substrate can be a single crystal substrate or may comprise a polycrystalline material. The substrate can be optionally prepared by treating the substrate sufficient to substantially remove any nucleation sites. For example, the substrate can be cleaned to remove debris and/or treated to create surface features which suppress random nucleation across the substrate surface during deposition.

In another optional embodiment of the present invention, the exposed surface of the crystalline substrate can be etched to form a pattern of pits based on the crystallographic orientation of the exposed surface. In particular, a cubic (100) face of an exposed surface may be mildly etched sufficient to form octahedral (111) face pits on the exposed surface. Suitable etchants can be used which selectively remove atoms from lattice positions to form regular (111) face pits along the exposed surface.

Once the crystalline substrate has been suitably prepared using one or more treatments, a transition region can be deposited on the exposed surface of the substrate using a liquid phase process. The transition region has a compositional gradient from the crystalline substrate to a second region having a different composition from that of the crystalline substrate. The transition region may be formed under substantially epitaxial growth conditions such that the transition region maintains the same basic crystal structure, although variations in lattice parameters such as atomic distances can, and likely will, vary. The transition region can have a continuous or discontinuous compositional gradient from the first region to the second region and may optionally include one or more intermediate compositions between the crystalline substrate and the second or target regions.

As mentioned previously, the methods of the present invention allow formation of compositionally graded inorganic crystalline materials having significantly lower defect rates than conventional approaches. For example, the transition can be substantially epitaxial such that the second region has less than twice a number defects in the crystalline substrate. Depending on the particular starting materials and process conditions, the number of defects may be less than that in the underlying crystalline substrate.

There has thus been outlined various features of the invention so that the detailed description thereof that follows may be better understood, and so that the present contribution to the art may be better appreciated. Other features of the present invention will become more clear from the following detailed description of the invention, taken with the accompanying claims, or may be learned by the practice of the invention. Additional features and advantages of the invention will be apparent from the detailed description which follows which illustrates, by way of example, features of the invention.

BRIEF DESCRIPTION OF THE DRAWINGS

FIG. 1 is a schematic cross-sectional view of a section of a compositionally graded inorganic crystalline material in accordance with one embodiment of the present invention.

FIG. 2A is a unit cell for diamond or silicon having two (100) cubic faces shown in bold lines.

FIG. 2B is a unit cell for diamond or silicon one (111) octahedral face shown in bold lines.

FIG. 2C is a section of a (111) crystal face having uniformly spaced (100) face pits distributed thereon in accordance with one aspect of the present invention.

FIG. 2D is a close-up view of a single (100) pit from FIG. 2C having a cube oriented therein as an illustration of the crystal faces of the pit in accordance with one aspect of the present invention.

FIG. 2E is a section of a (100) crystal face having uniformly spaced (111) face pits distributed thereon in accordance with one aspect of the present invention.

FIG. 2F is a close-up view of a single (111) pit from FIG. 2E having an octahedral oriented therein as an illustration of the crystal faces of the pit in accordance with one aspect of the present invention.

FIG. 2G is a side illustration of pits and tips of FIG. 2C in accordance with one aspect of the present invention.

FIG. 2H is a side cross-section during growth of FIG. 2G showing segregated growth regions in accordance with one aspect of the present invention.

FIG. 2I is a side cross-section subsequent to merging of growth regions from FIG. 2H in accordance with one aspect of the present invention.

FIG. 2J is a side illustration of pits and tips of FIG. 2E in accordance with one aspect of the present invention.

FIG. 2K is a side cross-section during growth of FIG. 2J showing segregated growth regions in accordance with one aspect of the present invention.

FIG. 2L is a side cross-section subsequent to merging of growth regions from FIG. 2K in accordance with one aspect of the present invention.

FIG. 3A is a schematic illustration of a silicon lattice (lower portion) transitioning to a SiC lattice crystal structure (upper portion) in accordance with one aspect of the present invention.

Figure 3B:
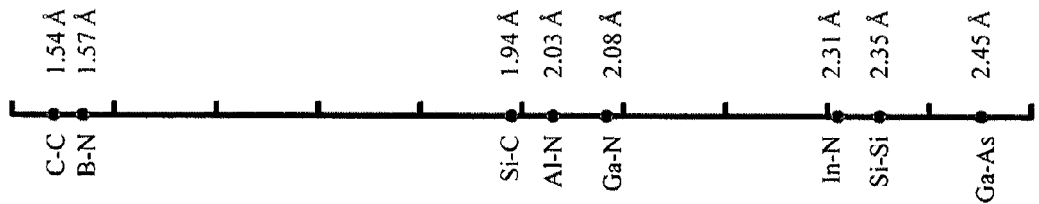
FIG. 3B is a scale showing relative lattice distances between atoms of various materials.

It will be understood that these figures are provided merely for convenience in describing the invention and are drawn for purposes of clarity rather than scale. As such, actual dimensions may, and likely will, deviate from those illustrated in terms of relative dimensions, curve durations, and the like. For example, a crystalline substrate as shown in FIG. 1 may be a silicon wafer having layer deposited thereon. In such a case, the thickness shown in FIG. 1 would be vastly thinner than actually illustrated, e.g. 6-12" diameter versus 0.2-1.5 mm thickness.

DETAILED DESCRIPTION

Reference will now be made to exemplary embodiments and specific language will be used herein to describe the same. It will nevertheless be understood that no limitation of the scope of the invention is thereby intended. Alterations and further modifications of the inventive features, process steps, and materials illustrated herein, and additional applications of the principles of the inventions as illustrated herein, which would occur to one skilled in the relevant art and having possession of this disclosure, are to be considered within the scope of the invention. It should also be understood that terminology employed herein is used for the purpose of describing particular embodiments only and is not intended to be limiting.

A. Definitions

In describing and claiming the present invention, the following terminology will be used.

The singular forms "a," "an," and "the" include plural referents unless the context clearly dictates otherwise. Thus, for example, reference to "a transition region" includes reference to one or more of such regions, reference to "an alloy" includes reference to one or more of such alloys, and reference to depositing or heating refers to one or more of such processing steps.

As used herein, "continuous compositional gradient" indicates a gradual change in composition, not a stepwise change or layered structure having distinct compositional or thermal expansion coefficient boundaries. Thus, the gradual change can include multiple transitions among various distinct intermediate materials or a direct gradual change from the first composition to the second target composition. As such, a "continuous compositional gradient" excludes substantially homogeneous materials, distinctly layered materials, or any materials having non-continuous changes in composition or thermal expansion coefficient.

As used herein, "crystallographically oriented pits" refers to pits or recessed regions having side walls corresponding to a specific crystal plane orientation, e.g. (100) face pits, (111) face pits, etc. For example, a (100) face pit has sidewalls along the (100) plane of a crystal lattice. Crystallographically oriented pits are further often a majority or substantially uniformly spaced across a surface and most often are substantially all oriented having the same crystal planes exposed on sidewalls. For example, crystallographically oriented pits formed on a (100) surface tend to be a majority or substantially all (111) face pits on silicon substrates.

As used herein, "cycling" refers to periodic repetition of an action. Further, a cycle also requires that the variable increase and decrease in order to cycle. In contrast, a "stepwise" change in a parameter with time includes either a change in the rate of increase or decrease with intermittent optional stabilization of the parameter for a known period of time. Thus, "cycling" does not include scenarios where the parameter merely varies in value and has a rate of change (i.e. slope of the parameter versus time) which does not change sign (e.g. positive to negative). In addition, cycling does not require symmetric cycles or periods. For example, a parameter may trend upwards while cycling about an increasing value and/or consecutive cycles may have different time and/or magnitude variations so that each cycle can be independent of other cycles. Such variations in consecutive cycles can be desirable in order to compensate for variations in different materials or to compensate during deposition for unanticipated effects. For example, defect rates for different materials may vary such that as a destination material becomes more dominant in the composition, a higher or lower defect rate can require a change in etchant frequency, concentration, etc. in order to compensate.

Figure 6:
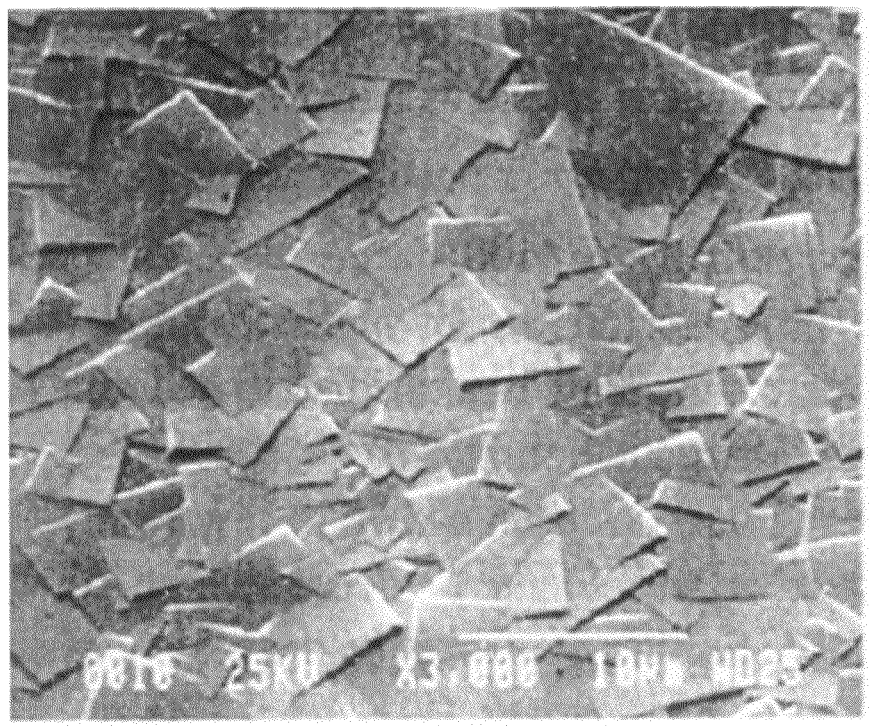
FIG. 6 is a micrograph of a diamond single crystal grown on a (111) substrate in accordance with one aspect of the present invention.

As used herein, "single crystal" refers to a monocrystalline material which is substantially a continuous single crystal lattice having substantially no grain boundaries. Crystals having multiple crystal domains which abut at grain boundaries are referred to as polycrystalline material. Lattice defects (e.g. impurities, dislocations, vacancies, cracks, etc.) are currently unavoidable in almost all crystalline materials; however, many applications can require meeting known maximum thresholds for defects in various devices. As a general rule, most electronic devices benefit from lower lattice defect rates. Thus, a single crystal can have defects such as dislocations, while the presence of grain boundaries indicates polycrystalline structure. Although surfaces of single crystals can be relatively smooth, in some cases dislocation densities and other defects can be sufficient to produce a mosaic single crystal structure such as those shown in FIG. 6 and FIG. 7. Such structures, although still considered single crystal, exhibit dislocations and non-uniformities within the crystal lattice which are substantially not grain boundaries.

As used herein, "region" refers to a volume of material which can be characterized by dimensions, composition, or other relevant properties. For example, the regions identified herein as first, second, transition, target regions, and the like can be distinct volumes characterized by specific compositions, or can be characterized by a thickness or composition within a given range. Thus, in some embodiments, a compositionally graded material can be formed in a single composite material having multiple regions therein characterized by variation in composition.

As used herein, "thermal expansion coefficient mismatch" refers to the percent difference between the thermal expansion coefficients of two materials, i.e. $|(\alpha_2-\alpha_1)|/\alpha_1 \times 100$, where $\alpha$ is the linear thermal expansion coefficient.

As used herein, "alloy" refers to a solid or liquid solution of a metal with a second material. The second material may be a non-metal, such as carbon, a metal, another alloy, or combinations of materials which enhances or improves the properties of the resulting alloy.

As used herein, "cubic crystal face" refers to the (100) face of a crystal lattice.

As used herein, "diamond-containing materials" refer to any of a number of materials which include carbon atoms bonded with at least a portion of the carbons bonded in $sp^3$ bonding. Diamond-containing materials can include, but are not limited to, natural or synthetic diamond, polycrystalline diamond, diamond-like carbon, amorphous diamond, and the like.

As used herein, "vapor deposited" refers to materials which are formed using vapor deposition techniques.

As used herein, "vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), metal-organic CVD (MOCVD), sputtering, thermal evaporation PVD, ionized metal PVD (IMPVD), electron beam PVD (EBPVD), reactive PVD, and the like.

As used herein with respect to an identified property or circumstance, "substantially" refers to a degree of deviation that is sufficiently small so as to not measurably detract from the identified property or circumstance. The exact degree of deviation allowable may in some cases depend on the specific context. Thus, for example, a source material which has a composition "substantially" that of a particular region may deviate in composition or relevant property, e.g., thermal expansion coefficient, by experimental error up to several percent, e.g., 1% to 3%.

As used herein, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

B. Embodiments of the Invention

It is to be understood that the following description is only exemplary of the principles of the present invention, and should not be viewed as narrowing the appended claims.

Referring now to FIG. 1, a compositionally graded inorganic crystalline material 10 includes a crystalline substrate 12. A second crystalline region 14 comprises a material having a composition which is different from that of the crystalline substrate. Further, a transition region 16 connects the crystalline substrate and second region. The transition region has a compositional gradient from the crystalline substrate to the second region. In addition, the transition region may be substantially epitaxial with the underlying crystalline substrate. In some embodiments of the present invention, the second region can have less than twice a number defects in the crystalline substrate, although the defect rate is generally substantially lower than achieved using conventional grading.

The compositionally graded inorganic crystalline material of the present invention may be formed using any number of suitable processes. In one embodiment, a crystalline substrate can be prepared, e.g. by cleaning, chemical etching, carbonization, or the like as discussed in more detail below. The transition region may be on the substrate such that the transition region has a compositional gradient from the crystalline substrate to a second region under substantially epitaxial growth conditions. The transition region can have a continuous or discontinuous compositional gradient from the first region to the second region. Each of these aspects of embodiments of the present invention will be described in more detail in the following passages.

Substrates

The crystalline substrate which forms the first region can comprise any suitable crystalline substrate upon which epitaxial growth can be performed. In one aspect of the present invention, the first region can be a pre-existing crystalline mass such as a silicon wafer, electronic substrate, sintered body, or other mass. Alternatively, the first region can be formed simultaneously with or in the same process as the transition region. In some embodiments, the first region can be an existing material or substrate. For example, the first region can be an existing wafer such as a silicon, silicon carbide, aluminum nitride, gallium nitride wafers, etc. Alternatively, the crystalline substrate can be formed using reclaimed silicon wafers, dipping in molten silicon, vapor deposition, or the like.

For many applications the crystalline substrate can be a single crystal substrate. However, in some embodiments, the crystalline substrate can be either substantially single crystal or polycrystalline.

A wide variety of crystalline materials can be used as the crystalline substrate of the present invention. Non-limiting examples of suitable crystalline substrate materials can include or consist essentially of silicon, diamond, silicon carbide, gallium nitride, aluminum nitride, alumina, silica, gallium phosphide, gallium arsenide, gallium antimonide, germanium, indium phosphide, zinc oxide, zinc selenide, zinc telluride, cadmium selenide, cadmium telluride, combinations thereof, composites thereof, and doped variations of these materials. In one specific embodiment of the present invention, the crystalline substrate can comprise or consist essentially of a member selected from the group consisting of silicon, diamond, silicon carbide, gallium nitride, and aluminum nitride. In another specific embodiment, the crystalline substrate can consist essentially of silicon or silicon carbide.

Crystalline substrates can have a variety of crystallographic planes which are exposed at a surface and upon which the transition region can be deposited. Referring again to FIG. 1 an exposed surface 18 can be a cubic crystal face. However, other crystallographic planes may also be suitably used as an exposed surface for formation of the graded materials of the present invention. Different crystal faces may be more suitable for particular applications. For example, the (111) surface of silicon is atomically packed much tighter than the (100) surface. If a (111) surface is used to react with carbon in forming the transition region, silicon carbide will be oriented along the (0002) basal plane that that can be subsequently used to form wurtzitic GaN by MOCVD. On the other hand, if (100) is used as the exposed surface, the cubic face of 3C SiC will be formed. Analogously, GaN may form with a cubic lattice that is highly suitable for making high intensity LEDs and laser diodes. In the case of silicon grading to silicon carbide, the silicon carbide may be formed on either a (100) or (111) face of silicon. If (100) is used, the cleavage planes can be used to form reflection mirrors for resonating the wave formed (e.g. for laser diode).

Although the above examples are related to forming silicon carbide on a silicon lattice, the same principles apply to other materials such as depositing silicon carbide on aluminum nitride. Although expensive, aluminum nitride single crystal substrates are commercially available and are typically deposited on a sapphire substrate. Because SiC and AlN have similar lattice constants and are about the same size, the gradation between the two is easier than for some other materials. For example, AlN can be carbonized with ion implantation as discussed in more detail below. Silane and methane (or acetylene) can be decomposed later to form a SiC lattice via a transition region. Etchants such as hydrogen or fluorine may be introduced to scavenge non-equilibrium or non-bonding atoms during formation of the transition region.

In some cases, the crystalline substrate can be joined with a temporary support. For example, polysilicon can be deposited and then wafer bonded with another polysilicon wafer. This approach may be suitable for thin diamond wafer substrates produced using the methods of the present invention or any other available technique. This may also be used along with other options, such as substrates produced by casting with a molten Si—Ge alloy.

Regardless of the particular substrate, the methods of the present invention can benefit from properly preparing the exposed surface of the crystalline substrate. In one aspect of the present invention, the substrate can be prepared by treating the exposed surface of the substrate sufficient to substantially remove any nucleation sites. The resulting treated substrate is an unseeded substrate which has also been stripped of any debris or other features which can act as nucleation sites. In one alternative embodiment, the exposed surface can be prepared by thorough cleaning such as by KOH soaking and/or ultrasonic treatment with deionized water.

In accordance with several embodiments of the present invention, a conformal heteroepitaxial deposition of the transition region is desired. In order to make a conformal heteroepitaxial deposition, spontaneous nucleation can be substantially, if not completely, suppressed. One approach is to coat the crystalline substrate, e.g. a silicon wafer, conformally with amorphous carbon. As carbon atoms are much smaller than silicon atoms (and most other crystalline substrate atoms), substantially every silicon atom at the interface will be in contact with at least one carbon atom. Subsequently, the amorphous carbon can be heated in vacuum to form SiC on the exposed surface. This silicon carbide layer, although a few atoms thick, is continuous with a lattice that is dictated by the underlying silicon. This silicon carbide layer can be further perfected and graded into silicon carbide by depositing a transition region as described in more detail below.

The conformal carbon coating can be applied using any suitable deposition process such as either a PVD method (e.g. sputtering or ion implantation of carbon ions) or a CVD method (e.g RF, pyrolysis of methane without hydrogen). Alternatively, the conformal amorphous coating can be formed inside a diamond film CVD reactor using conditions similar to conventional diamond growth with the absence of seeding. One factor for this process is that the substrate surface may not contain substantial non-Si impurities that may induce spontaneous nucleation. Hence, in some embodiments, the crystalline substrate can be free of previous seeding treatments such as ultrasonic agitation with nano or micron diamond. Similarly, in some embodiment, the crystalline substrate or wafer should generally contain low dislocation densities and low dopant contents sufficient to prevent unacceptable defect rates in the resulting second region after deposition of the transition region.

As a general outline, the crystalline substrate can be prepared by carbonizing an exposed surface of the substrate. Similar to the above discussion, carbon can be deposited at the exposed surface by either pyrolysis of a carbon-containing gas or ion implantation. The exposed surface can then be heat treated sufficient to correct at least some crystalline defects and to form carbide bonds between the substrate and deposited carbon to form a carbonized substrate. The carbonized substrate thus has carbon atoms bonded in the same crystal lattice structure as the underlying crystalline substrate. Excess carbon can be optionally removed by hydrogen treatment of non-carbide bonded carbon. The hydrogen gas acts as an etchant of amorphous carbon without substantially affecting the carbide bonded carbon. In the case of silicon substrates, the resulting material is a carbon rich silicon wafer with a smaller lattice that is more compatible with silicon carbide.

Alternatively, the substrate surface can be modified via gasification of substrate atoms and replacement of the same by decomposition of a source gas. In this case, a source gas (e.g. methane, ammonia, etc.) and an etchant can be simultaneously introduced. For example, silicon atoms in a silicon wafer lattice can be gasified by suitable etching, e.g. hydrogenation or fluorination. The vacancies left by the removed silicon atoms can be filled by carbon atoms via decomposition of methane. The replacement can be performed sufficient to form a SiC lattice across the surface which may be optionally continued to eventually form diamond. The removal of lattice atoms from the substrate is more prominent near the surface while tapering with depth into the surface. Thus, this approach can be an optional method to form a graded transition region by reverse deposition. Temperature conditions, gas concentrations and other variables can be controlled sufficient to avoid infiltration or doping into the substrate and preferentially cause atomic substitution within the crystal lattice. Further, selectively replacing substrate lattice atoms with a target atom generally benefits when the substrate lattice atoms and target atom have sufficiently similar lattice parameters to allow substitution within a crystal lattice of the substrate without introduction of substantial lattice defects similar to other embodiments described herein with respect to deposition of a transition region. This approach can also be used to form other crystal substrates such as, but not limited to, aluminum nitride, diamond, or other materials listed herein. Atomic substitution can further beneficially decrease the number of defects and impurities, since etchants preferentially target impurities.

In yet another aspect of the present invention, the crystalline substrate can be prepared by etching a (100) face of an exposed surface of the substrate sufficient to form (111) face pits on the exposed surface. Alternatively, a (111) face of an exposed surface can be etched sufficient to form (100) face pits. Both silicon and diamond have the same unit cells and primarily only differ in the bond distances and atomic sizes. Referring now to FIG. 2A, a silicon or diamond unit cell is shown with two (100) faces highlighted. FIG. 2B shows a diamond unit cell with a single (111) face highlighted. As can be seen removal of a corner carbon from the unit cell exposes a (111) face. The angle between the (100) face and the (111) face is about 54.7° such that the exposed (111) faces of the pits will be tilted or angled from the original (100) upper exposed surface. Etching of a (100) face is limited in duration sufficient to form pits with an exposed (111) face on a nano or micron scale. Etched pits having a (111) face have a single unpaired electron, while a (100) face etched pit will have two unpaired electrons. Typically, the pits can be sufficiently controlled such that they are spaced on a nanoscale, i.e. less than about 500 nm, and often much less than 100 nm such as from about 50 nm to 100 nm or from about 20 nm to about 100 nm. The etchant can be any suitable etchant, although hydrogen and fluorine gas are currently envisioned as most useful. Hydrogen can generally be used at around 800° C., while fluorine offers lower etching temperatures around 500-600° C. Temperature and gas flow rates can be adjusted to keep growth epitaxial as a single crystal with minimized defect densities. For example, higher gas flow rates can decrease process growth times, but can also increase lattice defect rates if not carefully monitored.

As a further illustration of the aspect, FIG. 2C shows a (111) exposed face which has been etched to form (100) face pits. FIG. 2D illustrates the (100) nature of these pits by showing a cubic crystal within a pit. Analogously, FIG. 2E illustrates a (100) face etched to form (111) face pits. FIG. 2F conceptually shows an octahedral crystal within a pit as an illustration. As can be seen from these figures, ideally the pits are substantially uniformly spaced such that merging into a single crystal is facilitated. Although some defects in pit placement and formation can be tolerable, this should generally be minimized for most electronic applications, e.g. LED, SOD, and the like. However, in some embodiments, uniformity of pits can be optional so that pit placement can be irregular such as when forming polycrystalline transition regions. Alternatively, the pits can be etched using photolithography for a sufficiently limited time to achieve the desired pit structure, e.g. either a three or four sided pit having (111) or (100) faces. This can improve uniformity while also increasing process steps and time.

Deposited atoms inside the pits will be governed structurally by surrounding atoms. The atoms on the peaks of the silicon wafer will be gradually eroded away due to the exposure to the etchant of hydrogen atoms which can be continually present or cycled in concentration. Because the nuclei are very tightly packed and have the same crystal orientation growing lattices from neighboring pits can eventually merge to form a continuous single crystal as illustrated by FIGS. 2G-2I and 2J-2L, respectively. In the final product, the transition region and crystalline substrate meet at an interface having crystallographically oriented pits along the interface filled with a portion of the transition region, although the interface can be difficult to identify due to a gradual gradation in composition.

In accordance with this embodiment, one difficulty is to introduce carbon atoms uniformly and place them at a previous Si site. Etching pits can allow C atoms to be deposited at a pit bottom where two (as in the case of a 100 orientation) or three (as in the case of a 111 orientation) coordinated atoms are already fixed in the lattice. The addition of carbon atoms at these sites would not disturb the underlying lattice of Si. If chemical gradation occurs more rapidly in these pits, the lattice can still be maintained because these foreign carbon atoms are surrounded by the bulk of a Si lattice. The use of pits also allows the deposition of C atoms or C rich molecules to proceed in three dimensions so the incorporation of C atoms can minimize lattice defects and mismatch stress. Once the pit is filled with SiC, these SiC domains can emerge as anchors which spread over the entire surface of a Si wafer and combine to form a substantially single crystal SiC.

If the pits are uniform and nucleation of carbon containing silicon clusters are gradual in these pits, the dislocation density can be minimized globally across the wafer surface. If grain boundaries form, they will be scarce and decorate large single crystal boundaries uniformly. In this case, single crystal devices can still be made with high yield by selecting single crystal areas of the wafer. The present invention allows uniform distribution of dislocations and a reduction in the total amount of dislocations. Optionally, a negative bias can be applied to nucleate the second phase.

The crystalline substrate composition and surface morphology can strongly influence and further align the epitaxially deposited transition layer. Nuclei formed in-situ inside the etched pits (measured in submicrons rather than 100s of microns in size) are already aligned. Furthermore, chemical gradation will assure that such alignment is maintained during the crystal growth of the transition region. In addition, the wafer surface can also dominantly chemically bond with the transition composition, i.e. substantially no mechanical bonding.

In another embodiment of the present invention, the above preparation and carbonization process can proceed continually with formation of the transition region. For example, intermittent or cycled hydrogen etching can be performed during deposition of the transition region. Although described in more detail later, this carbonizing process can be repeated by intermittent etching to form pits, and then carburizing the pits. Subsequently a negative bias can be added to nucleate the second phase, and then the second phase as either an intermediate region or target region can be deposited as described in more detail below. In one particular embodiment, these steps can be repeated to at progressively higher levels of C concentration, until the transition is complete from Si to either SiC or C.

The above embodiments of the present invention use a slanted crystal lattice to receive atoms from a vapor phase. For example, a Si wafer can be etched to form pits as described above. During deposition of a transition region, the deposited atoms have increased possibilities to land on a most energetically favorable lattice site of the substrate, e.g. increase in overall surface area as well as an increase in types of candidate bonding sites. This approach can also increase the matching of atoms between colliding ones and resting ones. This is particularly useful when more than one type of atom is deposited, e.g. C, Al, N, Ga, etc. In this case, atoms with different sizes or charges (e.g. Al, N) must both meet position accuracy and charge balance. The additional slanted lattice plane allows increased options for last minute adjustment of deposited atoms.

Another feature of the present invention is to form nuclei slowly so they can align with the substrate lattice before they become too big to allow repositioning. For example, by making silicon wafers super clean, foreign nucleus for grow on the surface can be minimized and/or avoided. By carburizing the surface, the atomic distance can be shrunk without altering the lattice and without introducing lattice defects such as cleavage planes, twinning, etc. Then applying a negative bias allows nucleation of SiC or diamond in the valley of the etch pit so orientation of the nuclei is fully aligned with the underlying lattice.

Further, the step of preparing can alternatively include doping the substrate to alter electronic properties according to well known principles, e.g. with P, B, N, etc. to selectively alter electronic conductivity.

Transition Region

Once the crystalline substrate is suitable prepared, the transition region can be epitaxially deposited thereon. A transition region can be formed which connects the crystalline substrate and second or target region. In one embodiment of the present invention, the transition region can have a continuous compositional gradient from the crystalline substrate to the second region. The transition region can be formed using any number of methods which allow for production of a continuous compositional gradient. Alternatively, the transition region can have a discontinuous compositional gradient. In embodiments having discontinuous compositional gradients, it can be desirable to minimize thermal expansion mismatch across discontinuous boundaries. This can be accomplished by a stepwise change in composition which results in a corresponding stepwise change in thermal expansion which reduces stress at such boundaries. Thicknesses of the transition region can vary somewhat depending on the composition of the substrate and target or second regions and any intermediate regions. However, as a general matter, the thicknesses can vary from several nanometers to several micrometers, e.g. about 2 nm to about 100 μm and in some case less than about 5 μm. For electronic applications, the thickness can generally be in the nanoscale and can often range from about 2 nm to about 100 nm, although other thicknesses may be useful.

Regardless of the specific process used to form the transition region, the transition region can include a wide variety of compositional gradient profiles. For example, the transition region can include at least one intermediate region having a composition different from either of the crystalline substrate or target regions. In order to produce such a material, a third source material can be included in the deposition process. The third source material can be deposited to form a portion of the transition region by variably adjusting deposition rates of each of the first, second and third source materials. Additional source materials can be included to form any number of intermediate regions, e.g., two, three, four, etc. When using a vapor deposition process to form the transition region, the rates of vapor deposition from each source material can be variably adjusted such that the continuous compositional gradient has a first gradient in composition from the first region (e.g. crystalline substrate) to the intermediate composition and a second gradient from the intermediate composition to the second region. Thus, in some cases, the compositional gradient can include a plurality of compositional sub-gradients. For example, multiple gradations to various materials can be produced. Any number of composition profiles can be designed based on the disclosure herein.

The transition region can have a wide variety of configurations and/or thicknesses based on the particular electronic device being formed. The actual thickness can vary considerably depending on the particular application and the thermal expansion mismatch between the first and second regions. An additional consideration in formation of the transition region can be the thermal expansion coefficient mismatch between the first region and the second region. Although not always required, keeping the mismatch below 5% can minimize the dislocation density in the epitaxial layer. However, if during the deposition, the composition can be kept with at least half of the element the same, then the lattice can be graded by the composition change as discussed above for changing Si to SiC. Further, the rate of gradation can be adjusted sufficient to not only minimize lattice defects, but also to minimize lattice stress by diffusing the same over a gradual transition of at least about 5 to 10 atoms thick, e.g. minimum of about 2-3 unit cells and often at least 5-10 unit cells. Further, as a general matter, the transition regions of the present invention, although gradual, can also be often less than about 20 unit cells per change in composition, e.g. Si to SiC, Si to GaN, AlN to SiC, etc. FIG. 3A illustrates a silicon lattice transitioning to a diamond lattice having substantially smaller interatomic distances without necessarily introducing vacancies, extra atoms, or other lattice defects. The Si to SiC transition will shrink the crystal lattice by 21%. A SiC to C (diamond) transition will shrink the crystal lattice by about 26%. Typically, such a large change in crystal lattice size will introduce unacceptable defects and mismatch stress; however, in accordance with the present invention, such a transition is possible. In one aspect of the present invention, at least half of the atoms may be the same at any moment of deposition at a surface of deposition of the crystal lattice. Similar gradations in composition can be achieved among a variety of materials such as those shown in the approximately proportional scale of FIG. 3B. Notably, the interatomic distances in the lattice of aluminum nitride and gallium nitride are similar to that of silicon carbide. Thus, silicon carbide can be a good intermediate material in preparing compositionally graded materials in accordance with the present invention which grade to aluminum nitride and gallium nitride The methods of the present invention can be applied to a wide variety of starting crystalline substrates and corresponding target regions via a suitably chosen transition region. Each of the transition regions and second regions can comprise or consist essentially of those listed for the substrate as well as other materials such as, but not limited to, silicon, diamond, silicon carbide, gallium nitride, aluminum nitride, aluminum phosphide, silicon nitride, alumina, silica, gallium phosphide, gallium arsenide, gallium antimonide, germanium, indium phosphide, indium nitride, zinc oxide, zinc selenide, zinc telluride, cadmium selenide, cadmium telluride, boron phosphide, cubic boron nitride, combinations thereof, composites thereof, and doped variations of these materials. Non-limiting examples of materials for target regions can include or consist essentially of a member selected from the group consisting of silicon carbide, diamond, nitrides, and combinations thereof. In another aspect of the present invention the target region can comprise or consist essentially of a member selected from the group consisting of silicon carbide, aluminum nitride, gallium nitride, indium nitride, composites thereof, and combinations thereof.

Gas Phase Formation of Transition Region

The above discussion mentions vapor or gas phase processes in forming the transition region. Vapor deposition can be accomplished by depositing materials from the vapor phase in which deposited material changes in composition as the transition region is deposited. Typically, this can be accomplished by varying the concentration of corresponding source gases to affect the rate of deposition of each species. A number of vapor deposition processes can be used in connection with the present invention such as physical vapor deposition (PVD) and chemical vapor deposition (CVD). Although PVD methods such as evaporation, sputtering, and arc methods can be used, epitaxial growth of deposited material can be difficult to maintain. Epitaxy can be maintained in some cases by intermittently treating the deposited material to allow atoms to rearrange into corresponding lattice positions. Each process has inherent advantages and disadvantages given a particular situation. For example, CVD methods can deposit materials at high temperatures from gaseous sources to typically form crystalline films. In contrast, PVD methods typically deposit materials in an amorphous form. The amorphous deposited material can then optionally be annealed to form crystalline structures via known processes such as devitrification.

One method of achieving a compositional gradient using vacuum coating methods such as PVD and CVD can include providing a plurality of source materials, either as a solid or in a vapor phase. Depending on the specific vapor deposition method, the source materials can be deposited on a desired surface. In the methods of the present invention, each source material is chosen such that the vapor phase produced thereby corresponds substantially to a desired region of the final material. For example, producing a transition region which has a compositional gradient directly from the first region to the second region can involve two source materials. A first source material can have a composition corresponding to that of the first region and a second source material can have a composition corresponding to that of the second region. For instance, in a CVD process, silicon can be deposited using a silicon-containing gas (e.g. silane) and carbon can be deposited using a carbon-containing gas (e.g. methane, ethane, etc.).

The deposition conditions can be adjusted such that the rates of vapor deposition from each source material can be variably adjusted to produce the desired continuous or discontinuous compositional gradient. Deposition conditions which can be adjusted depend on the specific process and can include, among other factors, DC current or applied bias, magnetic field strength, vapor source supply rates, vacuum level, and the like. The deposition of the transition region can include any process capable of epitaxially forming a transition region having a first or originating composition and a second or target composition, such that a continuous gradient in composition exists from the originating composition of the first region to the target composition of the second region.

For example, in one embodiment of the present invention, a CVD process can be used. A first and second source gas can be provided an enclosed chamber each having an independent flow rate control. Thus, in accordance with the present invention, the first source gas can initially be the sole source of deposited materials. Over time, the concentration of the first source gas can be decreased as the second source gas is increased. Thus, as the transition region is deposited, initial deposited portions have a composition corresponding to the first source material, which then gradually transitions in composition. Ultimately, the second source gas can be the sole source of deposited materials. The rate of variable adjustment can also depend on the desired thickness of the transition region and the intended application. Further, the compositional gradient need not be linear. Thus, the gradient in composition can be adjusted to provide specific properties to the final material. For example, the first portions of the transition region can have a composition which varies substantially linearly from the first region to an intermediate composition. A predetermined thickness at the intermediate composition can then be formed, followed by a continuous gradient to the second region. Other variations in the composition profile can be formed by those skilled in the art based on an intended application. In some embodiments, it can be preferable to ensure that there are substantially no discontinuous or abrupt changes in thermal expansion coefficient or composition.

In another detailed aspect of the present invention, high temperature can improve the growth of perfect single crystals such as diamond, but the hydrogen content must also be increased to maintain the bonding structure of carbon. High temperature also increases the growth rate of diamond so the methane content can be increased as well. As discussed in more detail below, oxygen may be introduced intermittently to oxidize any misplaced atoms so they would not be locked in the general lattice as a defect. Silane in hydrogen as a first source gas and methane (and/or ethylene or acetylene) as a second source gas can be variably introduced as described until the deposited film has a surface silicon to carbon atomic ratio of about 1:1. A $Si_xC_y$ can be grown slowly in the presence of ample hydrogen atoms sufficient to stabilize $sp^3$ bonds and gasify $sp^2$ bonds. In this manner, thin (e.g. 10 nm-1 micron) SiC epitaxial layers can be deposited on a silicon wafer with reduced lattice defects and improved electronic properties. The process can be continued to form diamond lattice on the silicon carbide, if desired, by adding more and more methane relative to silane to a silicon to carbon ratio of about 0:1. Again, the deposition gases can be highly diluted in hydrogen plasma to ensure the removal of non-equilibrium atoms that are not located at appropriate lattice sites.

Chemical grading is necessary to adjust the lattice mismatch a discussed above, but it is not generally sufficient alone to assure epitaxial and lattice matched lineage of the underlying crystal structure without introduction of excessive defects into the lattice. In order to increase the number of atoms added to the right lattice site from the vapor phase, the gas (e.g. silane or trimethyl silane) not only contains the atom in the right bonding configuration (e.g. $sp^3$), but also the temperature of the deposition site may be maintained at a temperature that is high enough to allow atomic mobility for fitting the atoms into the equilibrium position but low enough to avoid disruption of the underlying crystal structure. The technology of physical vapor deposition (PVD) is often not capable of delivering such chemically stable atoms to the lattice site. Therefore, in some embodiments, the substrate can be heated to a temperature high enough to allow atoms to settle in the most favorable energy state in the surface site of the crystal. Chemically decomposed C and Si atoms are already prepared with the appropriate diamond bonding orbitals (i.e. tetrahedral $sp^3$). These atoms can conveniently fit in the correct lattice site with the right bonds. As a non-limiting example, for depositing crystalline silicon, a suitable temperature is 800° C.; silicon carbide is 1000° C.; and C (diamond) is 1200° C. As an illustration, if diamond film is deposited at 800° C., it would be too cold for carbon atoms to move to the equilibrium position in time before the next atom comes down and would typically form amorphous or graphitic carbon rather than diamond.

Chemical gradation in accordance with the present invention allows hetero-epitaxial deposition to behave more like homo-epitaxial growth. A slower gradation, allows for more homo-epitaxial. As illustrated in FIG. 3B, the atomic distance of C is much smaller than Si such that every replacement of C for Si will disturb the neighboring Si atoms. If replacement is very slow and gradual, such disturbances can be spread out so the overall structure may be maintained as illustrated in FIG. 3A. However, if the incorporation of C atoms is faster, there would be a misaligned point created. This can act as the start of a dislocation and a collection of dislocations becomes grain boundaries. Hence, higher numbers of dislocations results in smaller textured grains and a more polycrystalline crystal surface.

Figure 3C:
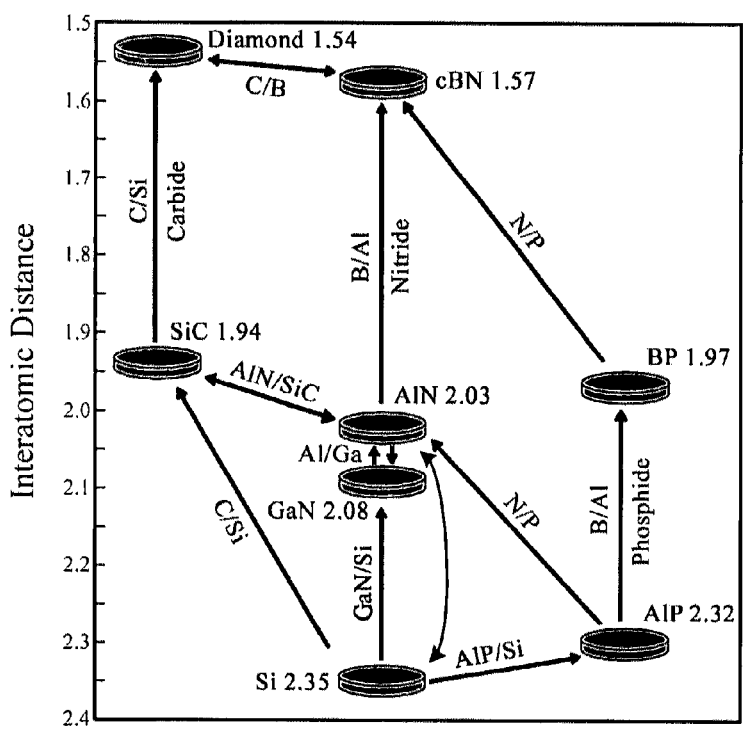
FIG. 3C is a chart illustrating several gradational pathways in accordance with several aspects of the present invention.
Figure 4:
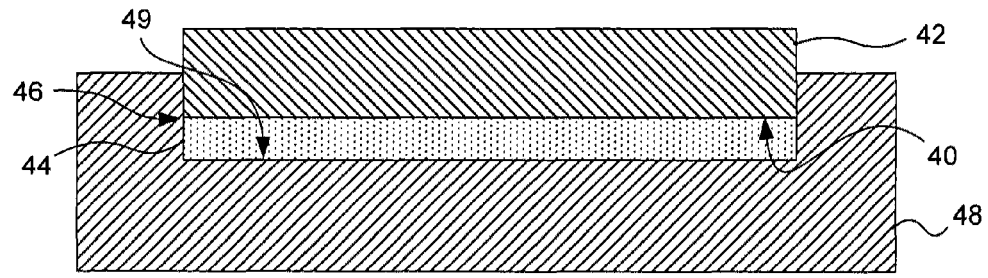
FIG. 4 is a side cross-sectional view of a liquid phase gradation assembly in accordance with one aspect of the present invention.

FIG. 3C is an illustration of several varied pathways for gradation of crystalline materials. Choosing the starting substrate, transition material, intermediates, and final region can involve balance of a number of factors including, but not limited to, availability of starting materials, cost, atomic size differences, interatomic bond distances within the lattice, stability of materials, and the like. For example, differences in atomic size and bond distances can be important factors which limit potential gradation pathways. FIG. 3C illustrates several pathways for achieving cBN, AlN, GaN, SiC, and/or diamond substrates using the methods of the present invention. The scale along the y-axis is interatomic bond distances for the pure substance in angstroms, while the x-axis has no dimensions is and used to visually separate the different pathways. Silicon as a starting material can be graded to silicon carbide and then to diamond or aluminum nitride. Alternatively, silicon can be graded through phosphides such as aluminum and/or gallium phosphide as intermediate(s) to gallium and/or aluminum nitride. Further, indium nitride may be used as an intermediate between silicon and gallium nitride and/or aluminum nitride, keeping in mind the relative volatility of indium nitride. In another alternative embodiment, cBN substrate can be formed via diamond, boron phosphide, and/or phosphide-nitride pathways as shown. Based on this guidance, other suitable gradation pathways can be designed for other production of other compositional y graded materials.

In another alternative aspect, foreign atoms (sufficient to act as nucleation sites) can be distributed uniformly such that the distribution of dislocations is also uniform as well as any grain boundaries. Silicon carbide on silicon can be grown hetero-epitaxially with uniform islands, within each island is a perfect lattice with Si graded to SiC. In a similar manner, the SiC can be further graded with carbon to form diamond.

Liquid Phase Formation of Transition Region

Although the previous discussion focuses on gas phase deposition of the transition region, the transition region can also be readily formed using a liquid phase process. As a general guideline, the liquid phase process can include contacting an exposed surface 40 of a crystalline substrate 42 with a molten liquid medium 44 under a temperature gradient. The exposed surface can be at a lower temperature than a bulk temperature of the molten liquid medium. The liquid medium includes a solvent alloy and a target source material corresponding to a target composition of the second region somewhat analogous to the second source gas in the gas deposition process.

Epitaxial growth can be controlled by adjusting the ratio of substrate atoms (e.g. Si) and target atoms (e.g. C) at the interface 46. Although the gas phase deposition can be effective, the collision distance (mean free path) is 10000 times longer than a comparable condensed liquid system. Liquid is a condensed system with the atomic collision distance three orders of magnitude smaller than in a gas phase such that the kinetics of deposition and defect removal are much faster. Consequently, it can be desirable to deposit SiC on Si wafer in a liquid medium. Other materials as mentioned previously can also be similarly deposited using the liquid phase approach. For purposes of illustration, the following discussion focuses on deposition on a silicon wafer; however the same principles can be applied to the other substrates listed above.

In order to add carbon atoms onto the surface of a silicon wafer in a liquid medium, the liquid can meet several criteria. For example, the liquid medium can be a solvent of carbon (e.g. at least about 0.06% and often at least about 0.1% when molten). Non-solvent liquids, such as copper or lead cannot deliver the necessary flux of carbon solute. On the other extreme, carbide formers, such as lithium or magnesium, can tie up carbon so the solubility of carbon is minimal. Liquid mediums also do not substantially react with Si to form silicides. As a general rule, carbide formers are also silicide formers (e.g. Ti, Cr). Hence, by using a carbon solvent, silicide formers can be avoided. In accordance with the present invention, the liquid medium can also dissolve silicon, but at a much lower rate than carbon. This can help to blur the interface. Otherwise, smaller C atoms cannot line up with large Si atoms. By using a solvent with high solubility of C, but low solubility of Si, carbon atoms can be swapped for silicon gradually so as to achieve a chemical gradient required to maintain the continuation of Si lattice. Thus, the primary growth in the liquid phase deposition occurs beneath the exposed surface such that the transition region diffuses into the original crystalline substrate and/or involves erosion of some of the original surface followed by rebuilding of the lattice structure as a graded material. However, some deposition growth can also occur in some embodiments so as to increase the overall thickness of the wafer. Another consideration for the liquid medium is to provide a composition that is a liquid at a temperature when silicon is still rigid without disintegration. Accordingly, a temperature for the melting of the solvent is 700° C. to 1100° C. can be particularly suitable. If the melting temperature is too low, kinetics of epitaxial growth will be slow and the removal of crystal lattice defects can be difficult. Although other materials can also satisfy these considerations, non-limiting examples of suitable liquid materials can include, rare earth element alloys such as La alloys, e.g. La—Mn eutectic (701° C.), La—Ni, La—Mg, La—Pb, etc. and Ce alloys, e.g. Ce—Co eutectic (443° C.), Ce—Ni—Fe, Ce—Ni, Ce—Cu, etc. or Fe—Ni—C eutectic (about 1100° C.). Lanthanum (or its alloys) and graphite powder can be used as the source materials for the solvent, as one example. In this case, graphite can preferably be high purity and with a high degree of graphitization, e.g. >0.9 and may be any suitable particle size, e.g. about 20 microns.

More particularly, a powder mixture can be prepared of a solvent alloy and a target source material. Rare earth element (e.g. La, Ce) alloys may be used as the solvent. The solvent can be mixed with graphite powder or other suitable carbon source and placed inside of a graphite container 48. The powdered layer can be leveled horizontally. The crystalline substrate 42 can be placed in contact with the powder mixture either before or after heating the powder mixture sufficient to melt the solvent alloy and initiate epitaxial growth of the compositional gradient. Heating may be accomplished using any suitable approach, e.g. electrical heaters or the like.

In one alternative embodiment, the powder mixture can include a layer of starting powder which corresponds in composition to the crystalline substrate. The layer of starting powder can be oriented between the target source material and the crystalline substrate. This layer of starting powder can be a distinct layer or can be optionally partially mixed with the other powders. In either approach, the starting powder can be in sufficient proximity to the crystalline substrate to allow the predominant growth and deposition to include starting powder atoms with a gradual increase in target atoms as diffusion among the molten materials occurs. The rate of diffusion can be thus controlled using either or both of temperature differentials across the molten liquid and designed powder mixture configurations, e.g. layers or graded powder mixtures.

Any suitable material can be used as the substrate and target regions for liquid phase in the same manner as with gas phase embodiments. In one specific embodiment of the present invention, the crystalline substrate can comprise or consist essentially of silicon or aluminum nitride. Similarly, in one very specific embodiment, the target source material can include carbon and the solvent alloy can be a carbon solvent.

A silicon wafer can be placed on the powdered medium and pressed by a dead weight (e.g. an alumina plate). Under high vacuum (e.g. micro torr), the powder medium is melted (e.g. around 900° C. in some cases) so silicon is contacted with the molten liquid. The rare earth alloy will dissolve graphite to form carbon solutes. By maintaining a temperature gradient with the silicon wafer located at the cold end, a carbon flux can be created due to the solubility difference of carbon at various temperatures. As a general guideline, the temperature gradient from the exposed surface 40 of the silicon wafer to an opposite lower surface 49 of the graphite mold 48 can range from about 20° C. to about 80° C. such as about 50° C., although this can vary depending on the specific compositions and geometry of the system. By controlling the carbon flux, carbon atoms can be added gradually to the existing silicon lattice. Initially silicon would also be dissolved in the liquid. With the arrival of more and more carbon atoms, the Si/C ratio will decrease and form a continuous lattice with the composition graded from Si to SiC. In one optional embodiment, the temperature may be cycled to cause repetition of deposition and dissolution. During the dissolution stage, the non-equilibrium atoms will go back to the solution first. Eventually, the lattice can be relatively perfect with a low concentration of dislocations (e.g. millions per square centimeter which is on the par with current semiconductors). The produced SiC epitaxial layer can be further purified by subjection to CVD treatment (e.g. with silane and methane), heat annealing, and/or other suitable treatments. The resulting material includes a transition region having a compositional gradient in accordance with the principles of the present invention.

Cycling of Deposition Parameters

Although mentioned previously, the step of depositing can optionally include cycling of at least one deposition parameter sufficient to remove defects in a crystal lattice of the transition region. A number of deposition parameters can be varied sufficiently to achieve the desired effects. Non-limiting examples of deposition parameters which may be varied include etchant concentration, source gas concentration, deposition temperature, applied bias, and combinations of these parameters.

In one specific embodiment, the etchant concentration can be cycled during deposition of the transition region. For example, an etching gas (e.g. $CF_4$ or $F_2$, $H_2O$ or $O_2$) can be periodically sent into contact with an exposed surface of the growing transition region that can vaporize the deposited atoms. Etchant will preferentially target mismatched atoms first. This exposure to etchant can eliminate or substantially reduce dislocations, grain boundaries, interstitial impurities, and other defects. This exposure of etchant can take place during cessation of other gases or can be introduced along with deposition gases. By repeating deposition and vaporization stages, those atoms that are firmly sitting on equilibrium sites of the crystal lattice are retained while misplaced atoms can be systematically removed. In some cases, such cycling can result in healing of certain crystal defects present in the underlying crystalline substrate.

Cycling of source gas compositions can be useful to cover or at least partially conceal the site of dislocations so the subsequent deposition may be more crystalline, the cycling of an etchant can be more effective in removing defects and results in a thoroughly crystalline structure with fewer embedded defects. Non-limiting examples of suitable etchant can include or consist essentially of $H_2$, $F_2$, $CH_4$, $CF_4$, $C_2H_2$ and combinations thereof.

In another embodiment of the present invention, source gas concentration can be cycled by varying a source gas concentration and a destination source gas concentration. Such variations can include a cyclical upward or downward trend.

In one specific embodiment, a destination source gas can be varied by a decrease which is less than an immediately preceding increase. In another detailed aspect, the destination gas source can be varied by a decrease less than 50% of the preceding increase. For example, a 5% increase in silane might be followed by a 3% decrease. In another example, a 2 unit increase can be followed by a 0.5 unit decrease. Similar cycling can be performed for the other deposition parameters. Alternatively, the destination source gas concentration can be increased in a stepwise fashion, while other parameters are cycled. In yet another alternative embodiment, a destination source gas concentration is increased substantially linearly during the step of depositing. Similar variations in the source gas concentrations, albeit in reverse, can also be applied. Cycling pulse duration, frequency, cycling profile, degree, and/or spacing of particular deposition parameters can be readily adjusted based on the particular materials, conditions, and the guidance provided herein. For example, degree of gradation can be decreased when the target or second region is substantially different, allowing for more time and atomic distances to effectively grade the composition. Further, high defect rates can be reduced by allowing for increased number of etching cycles per increase in source gas to gradually remove defects.

In another detailed aspect, the source gases can be varied during deposition of the transition region. In particular, a low quality source gas, e.g. gas having a relatively high impurity content, can be used to initiate gradation, while higher quality gases can follow to improve rate and purity of the deposited region.

Product Materials and Industrial Applications

Figure 7:
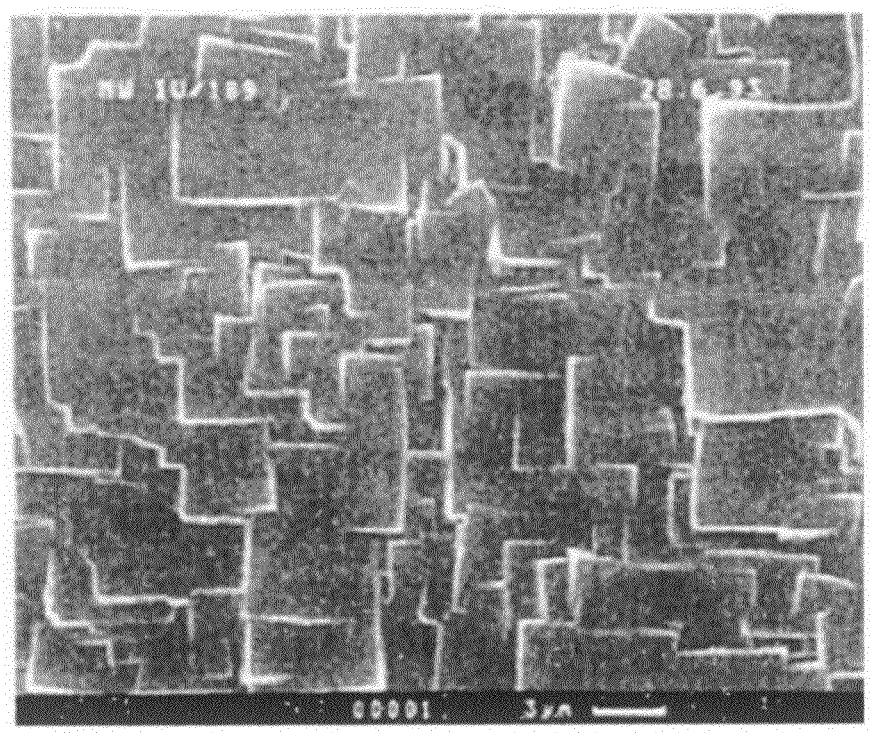
FIG. 7 is a micrograph of a diamond single crystal grown on a (100) substrate in accordance with one aspect of the present invention.

In accordance with the present invention, a compositionally graded inorganic crystalline material can be formed having substantially improved mechanical and electronic properties. In particular, the transition region connecting the crystalline substrate and second region can have a compositional gradient from the crystalline substrate to the second region. More particularly, the transition region can be substantially epitaxial such that the second region has less than about twice a number defects in the crystalline substrate. In certain embodiments of the present invention, the second region can have a defect density lower than that in the underlying crystalline substrate. In another more detailed aspect of the present invention, the defect density in the second region can be lower than the number of defects in the substrate by a factor of ten, in some cases by a factor of 50, and in other cases by a factor of 100, if carefully controlled. This is due, at least in part, to the cycling of parameters which not only acts to remove misplaced atoms within the crystal lattice, but can also correct existing lattice defects. In yet another detailed aspect, the second region can have a mosaic single crystal surface. FIG. 7 and FIG. 8 show micrographs of mosaic diamond gradationally attached to a silicon substrate which can be formed using the methods of the present invention from octahedral (111) and cubic (100) faces, respectively. As a point of comparison for defect densities, typical liquid pulled silicon ingots have defect densities on the order of 1E4 defects per $cm^2$, while gas phase produced gallium nitride defect densities are on the order of 1 billion defects per $cm^2$. The methods of the present invention allow for comparable or decreased defect densities in the grown layers over the defect rates in the underlying substrate. Thus, the defect densities of the grown second regions of the present invention can depend largely on the starting materials, while still minimizing introduction of additional defects and/or reducing the same.

In accordance with the present invention, the crystalline substrate can be crystallographically oriented such that a (100) face is substantially parallel to an interface between the first region and the transition region. The resulting compositionally graded inorganic crystalline material can be a cubic crystal having a substantially single crystal surface. In particular, substantially single crystal silicon carbide, aluminum nitride, gallium nitride and diamond wafers can be formed. These cubic materials can be useful in a wide variety of applications. Thus, for example, a cubic GaN single crystal having an ABCABC crystal structure can be readily formed by growing a suitable transition region on a (100) face of a suitable substrate. As a practical matter, (111) faces of crystals such as diamond are not readily polished and are also very inert and stable, while (100) faces are generally softer and can be easily polished.

One additional feature of the materials of the present invention includes a reduced residual interfacial stress across the transition region which is sufficiently low to substantially increase electron mobility compared to a material having the same composition of crystalline substrate and second region directly deposited without the transition region.

Optionally, the second region can be attached to a separate substrate or material as part of a larger product, e.g., semiconductor components, packaging, or the like as an optional device layer. The materials of the present invention are particularly useful for building electronic devices such as LEDs and other components. Diamond can be deposited on a non-diamond mold to avoid laborious polishing of diamond films. The mold may also be a semiconductor that can be used as a device layer as in the case of SOD and LED substrates. Alternatively, the mold can be a piezo-electric layer that can serve as the electromagnetic coupling agent for generating acoustic waves, as in the case of SAW filters.

A diamond film can be deposited on a suitable substrate (e.g. silicon) and then polished. Although polishing is costly, there are techniques to deposit diamond films with minimal roughness to reduce the polishing cost. For example, nano diamond (dispersed in ultrasonic bath to coat the substrate) enhanced nucleation or bias (e.g.—200 volts) enhanced nucleation can increase the density of diamond nuclei to 100 billion per square centimeter ($10^{11}/cm^2$). Alternatively, nano diamond itself can be nucleated without growth (e.g. by replacing hydrogen gas with argon gas). In such cases, the polishing work is very little. However, the diamond quality can be better than the nucleation side obtained by a reverse casting method.

The polished diamond film cannot generally be adequately bonded to a single crystal material (e.g. Si, GaN) for making useful electronic devices. Moreover, the semiconductor, even if bonded to the polished diamond film, cannot be readily or consistently thinned to micron size or submicron size on a large size wafer because the parallelism of thinning (during etching or polishing) cannot be maintained on a submicron scale of thickness. A reverse cast diamond with a mold (e.g. Si wafer) that is scratched beforehand so diamond will penetrate into these scratches to serve as a stopper during polishing can be useful. However, this is a cumbersome way to prevent overpolishing in certain areas when the thickness of the polished layer becomes uncontrollably thin.

The semiconductor industry has developed SOI (silicon on insulator) technology by implanting $H^+$ (i.e. protons) into silicon to a predetermined depth corresponding to a desired thickness. The implanted surface is then joined to an oxidized silicon by a technology known as wafer bonding. Subsequently, the implanted hydrogen coalesces to form bubbles by a process of hydrogen embrittlement. The coalescence can be triggered by either heating or microwaving. When hydrogen forms a gas, the wafer will split along the implanted interface so the thin layer above is split away. In this case it is bonded to the oxidized silicon. The final layout is then a very thin silicon layer bonded to a thick silicon at the interface of silicon oxide. The thin silicon serves as the device layer and the oxide becomes the insulator. The SOI technology can allow the densification of transistors beyond 90 nm node without causing current leakage that affects performance, generate heat and waste energy.

Figure 5A:
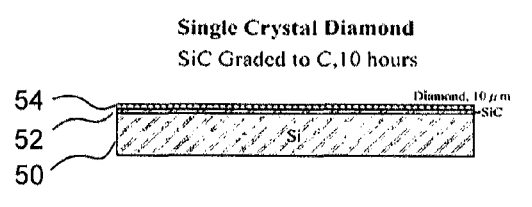
FIGS. 5A through 5H are side cross-sectional views of various stages in producing compositionally graded composite materials in accordance with aspects of the present invention.
Figure 5B:
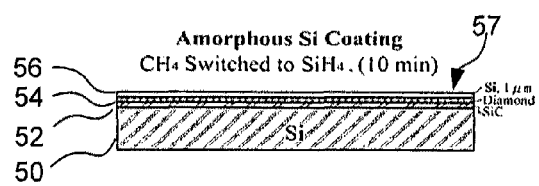

With this background in mind, in accordance with the present invention, FIG. 5A shows a silicon wafer 50 having a silicon carbide transition region 52 and a diamond second region 54 formed in accordance with the compositional grading of the present invention. The diamond second region can be optionally polished and then sputtered with an amorphous layer of silicon 56 as shown in FIG. 5B. This will convert the chemistry at the interface from C to Si. The wafer can then be heat treated to form SiC with increasing amount of Si on the exposed surface 57. Alternatively, the diamond wafer can be CVD coated with either Si or SiC, or a gradation of C to SiC to Si in accordance with any of the previously described approaches of the present invention.

Figure 5C:
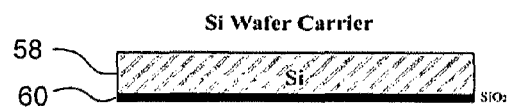
Figure 5D:
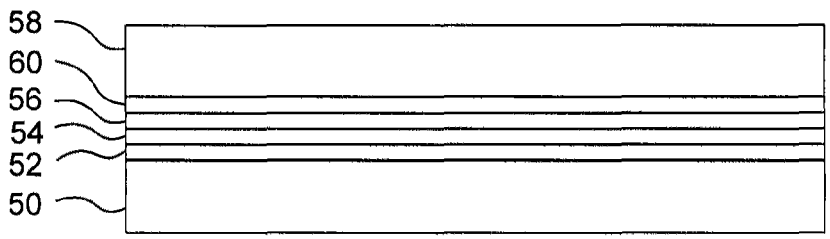

An optionally hydrogen implanted silicon wafer 58 can be prepared that is oxidized on one surface to form a silicon oxide layer 60 as shown in FIG. 5C. The oxidized silicon wafer of FIG. 5C can then be joined to the diamond wafer on SiC or Si enriched SiC of FIG. 5B to form the composite wafer assembly 62 shown in FIG. 5D. Joining can be performed at a temperature below that required to split the wafer by hydrogen gas formation, i.e. wafer bonding.

Figure 5E:
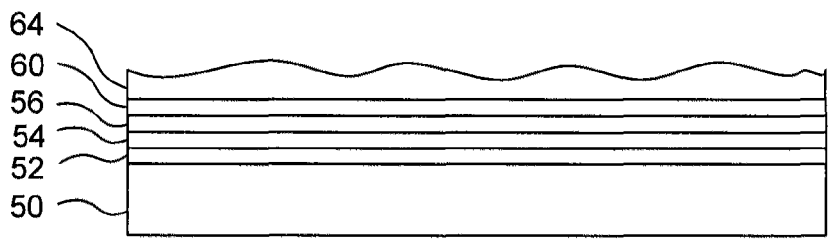
Figure 5F:
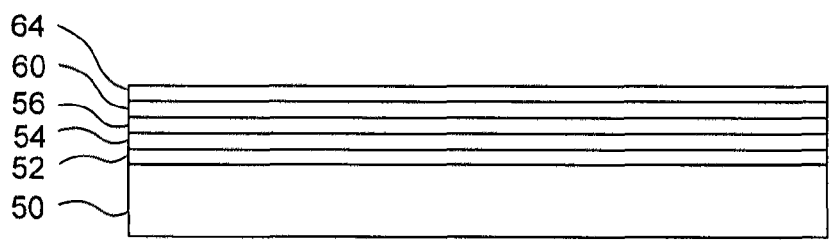

In one embodiment of the present invention, the composite wafer assembly 62 can be subjected to splitting. A hydrogen implanted wafer 58 can be split with either heating or microwaving as shown in FIG. 5E. The result is a thin split silicon device layer 64 that is attached to the diamond wafer 54 with an interface of silicon carbide 52 and silicon dioxide layer 60. Each layer can be pure and thermally stable sufficient to withstand subsequent processing temperatures. The split device layer 64 can be polished or CMP treated to make the surface super smooth as illustrated in FIG. 5F. This device layer can be used as a substrate to coat with a device layer (e.g. by CVD at high temperatures) to form a wide variety of electronic devices and serves as a silicon on diamond substrate (SOD). The quality of such an SOD would be better than reverse cast ones because the diamond surface used is the growth crystal rather than the nucleation side of diamond that are separated and have substantial graphitic component. As a result of the above approach, an SOD with a one micron single crystal silicon can be firmly bonded to a diamond wafer. The top layer can then be used as the device layer for making VLSI with 90 nm or smaller nodes or any other semiconductor device.

Normal SOI is made by implanting of hydrogen cations (protons), helium ions or oxygen. In accordance with the present invention, alpha particles (i.e. helium nuclei) or lithium cation (i.e. helium core) can also be used. Alpha particles can be more focused to a fixed depth of the Si wafer due to its double charge (proton is single charge and helium cation is also single charge). The helium gas formed from alpha particles can be more concentrated so the wafer splitting is cleaner. Moreover, the dosage of alpha particle required is less so the device layer is experiences less damage during the particle bombardment. An advantage of using lithium is it is very easy to ionize, i.e. much higher energy is required to strip electrons off either hydrogen or helium atoms. Lithium ions are also advantageous to implant oxides (e.g. sapphire or alumina) or nitrides (e.g. GaN) so the split thin layer is not limited to silicon. For example, a micron layer of sapphire can be split and bonded to a diamond wafer. This wafer can be used as an LED substrate, for example. The nitride (e.g. GaN) LED is commonly deposited on sapphire via a buffer layer of AlN. By using this wafer transfer technology, GaN from an LED substrate can be bonded directly to the diamond wafer. In this case, the sapphire substrate with or without the buffer layer can be etched away (not necessary to use ion implantation as described above). The GaN bonded diamond wafer can also be used as a SAW filter as GaN, like AlN, is piezoelectric. Similarly, lithium titanate, lithium niobate may also be bonded to a diamond wafer. In this case ion implantation can be used to split such piezoelectric layers.

Figure 5G:
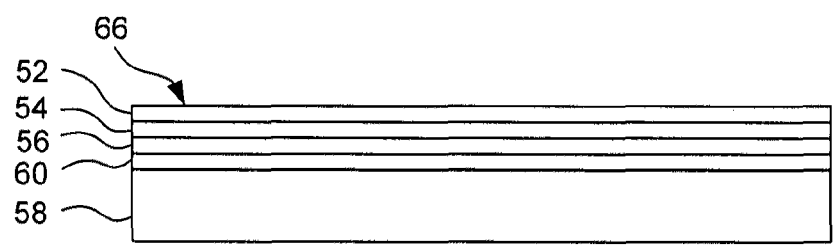
Figure 5H:
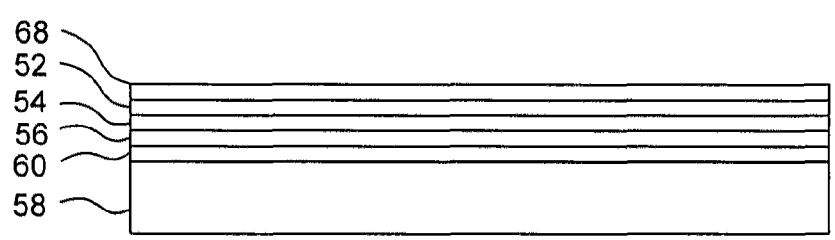

As mentioned throughout, silicon is not the only device layer that can be used. In particular, GaN for LED or for SAW filter may also be fabricated. All such devices will benefit from the superb electrical resistance and thermal conductivity of diamond. For example, the composite assembly 62 of FIG. 5D can be further processed by removal of silicon wafer 50. In this case the silicon wafer 58 need not be implanted. Instead, silicon wafer 50 can be removed by etching, CMP, or any other suitable method. Preferably, the removal process leaves substantially no debris, damage or added defects in the surface of the silicon carbide layer 52 as illustrated in FIG. 5G. The resulting composite assembly 66 can have a single crystal silicon carbide layer exposed and usable as a substrate for building any number of devices. For example, as shown in FIG. 5H a gallium nitride buffer or device layer 68 can be formed either directly or in a gradational approach as previously described (e.g. MOCVD using $GaH_3$ and $NH_3$) to form a gallium nitride single crystal substrate which can be used as an LED substrate, SAW filter substrate or other device substrate.

The availability of SiC wafers which have improved properties such as single crystal surfaces and/or reduced defect densities can benefit semiconductor, LED and solar cell industries. Applications of the present invention range from super fast IC (e.g. for super computers), extreme powdered laser diode (e.g. for development of destructive lasers), to post-silicon solar cells that may reduce reliance on fossil fuel power generation.

For application of the present invention to LEDs, light efficiency can be increased, e.g. in excess of 200 lumens/watt. The most effective way to increase the energy efficiency is by increasing internal quantum efficiency and external extraction efficiency using diamond as described herein. Diamond can increase energy efficiency due at least in part to high thermal conductivity, 2000 W/mK compared to 30 W/mK of sapphire ($Al_2O_3$). A 60-fold increase in thermal conductivity (and more in terms of thermal diffusivity) will make sure that the LED chip is cooled in real time when high electrical current is flowing through the semiconductor. The brightness of the LED is reduced with increasing temperature and the life of an LED will decrease at an exponential rate which problems can be avoided in accordance with the present invention.

Moreover, the internal quantum efficiency can be increased by a reduction in concentration of dislocations. Conventional LED substrate dislocations are in the order of one billion per square centimeter. This amount is four orders of magnitude higher than that of silicon. The high concentration of defects is caused by the large lattice mismatch (>15%) between growing nitride crystal and sapphire substrate. A single crystal SiC epitaxial layer formed on a silicon wafer in accordance with the present invention can be used to reduce lattice mismatch. The lattice mismatch between GaN and SiC is small (ca 3%). Using structural control of a high quality silicon wafer allows the dislocation density in SiC to be much less than conventional condensation methods for making SiC wafers. Silicon carbide epitaxial layers of the present invention also have no size limitation, e.g. as large as 300 mm. The gradational materials of the present invention further exhibit a decrease in internal electrical fields produced generated by piezoelectric materials such as wurtzitic nitrides and others. With the use of the present invention, internal mechanical stresses can be significantly reduced so as to minimize internal electric fields produced by internal mismatch stresses with piezoelectric materials. As a result, quantum efficiencies are improved because internal electric fields are not competing with the designed electric current.

Further, in the case of integrated circuits, electron mobility can be facilitated by lattice tension and hindered by lattice compression (i.e. hole mobility would be conversely effected). In the case of an LED, (Al,Ga,In)N are all a wurtzite structure that is piezoelectric. Under conventional GaN directly deposited on sapphire without gradation, the interfacial stress at the interface can be as large as 500 MPa (fifty thousands times atmospheric pressure). As sapphire is tighter in lattice size than GaN, the latter is compressed and then extended away from the interface. As a result, electrons from an N doped GaN that is next to the interface will converge while holes on the far side will diverge. As a result, the collision distance between them is increased, which translates to a lower internal quantum efficiency to make photons. By grading the interface, not only can the dislocation density be reduced, but also the stress can be reduced and/or substantially eliminated. Thus, a much higher conversion efficiency can be achieved when converting electricity to light. The stress reduced interface is particularly important with an increase in production wafer size, and also the increase of power/current.

Either tighter atomic spacing graded to looser atomic spacing or visa versa can be performed as discussed herein. The internal mismatch stress is therefore diffused across the transition region. It is important to recognize that the interatomic distance of SiC (1.94 A) is 26% larger than that (1.54 A) of diamond. When small carbon atoms are attached to the SiC surface to form island patches, these patches at different locations may have slightly different orientations. Hence, the final merged surface contains a mosaic of diamond tiles instead of a homogeneous layer of diamond lattice. As the ultrahigh pressure process uses a molten alloy (Fe, Co, Ni or its alloy) as solvent for the deposition of diamond layers, the misfit can be adjusted by reposition atoms in the liquid metal. Consequently, the final surface would be smooth and seamless.

In accordance with another aspect of the present invention, cubic boron nitride can be formed on the materials of the present invention. In contrast to diamond, N-dopant for cubic boron nitride is easily found (e.g. with P). But cubic boron nitride (cBN) single crystals produced under high pressure are typically poor in quality. The CVD process for depositing single crystal cBN has not been possible because of the lack of suitable substrates. All ceramic and metal substrates contain atoms that are too big for cBN. Now with the present invention, a diamond single crystal substrate can be made. Diamond and cBN are fully compatible (only 2% difference) in atomic sizes and lattice parameters. Hence, it is relatively easy to grow cBN single crystal film epitaxially on diamond single crystal substrate or via other similar routes such as those shown in FIG. 3C. A low defect layer of cBN of only a few microns thick is sufficient to make an N-type semiconductor. Hence, a P-type diamond can be joined with N-type cBN. Such a match is ideal for making super fast computer chips with high power. It is also ideal for making UV laser diodes because both diamond and cBN are wide bandgap semiconductors. In addition, cBN substrates can be more stable than even diamond for some applications, e.g. semiconductor and very fine frequency tuning.

A super performing cubic LED can be coupled with diamond film as the substrate, either for epitaxial growth or by brazing. In this case, the heat can be channeled out fast sufficient for the power of the LED to be increased. Potential applications can include LEDs used to machine most materials as laser razors (UV or visible) or as destructive weapon. The other example is to use the polycrystalline diamond film as the heat spreader by brazing. The original substrate for LED growth can be dissolved away similar to a reverse casting method.

Another aspect of LEDs is that conventional sapphire materials are both a thermal insulator (thermal conductivity less than 10% of copper) and electrical insulator. As a result, the power is limited due to the temperature rise. Additionally, the P-type and N-type electrodes must lie on the same side. This will bend the current and reduce the volume utilization efficiency of the doped semiconductors. If a SiC single crystal substrate is used, because it is semiconductor, the N-type electrode can be connected to SiC. In this case, the LED is symmetric with respect to electrode positions. Consequently, the volume utilization efficiency can be increased. In the case of an SOD, diamond is an insulator. Further, an SOD formed in accordance with the present invention, can be used as an electrode by doping boron in diamond. In fact, such doping would make it even more compatible to cBN if the latter is used as a gradational layer. Alternatively, diamond film can be partitioned with copper wire and the entire layer brazed to a low thermal expansion electrical conductor (e.g. W) to allow the SOD to be used as the electrode.

In yet another aspect of the present invention, an LED light is very pure with narrow width of wavelength spread. Hence, its color is very bright. A white LED may be produced by mixing three LED with red, blue and green (RBG) colors. Alternatively, an UV LED can be used to excite phosphors of RGB to emit white light. Another technique is to excite a yellow phosphor with a blue LED.

C. EXAMPLES

The following examples illustrate exemplary embodiments of the invention. However, it is to be understood that the following are only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following examples provide further detail in connection with what is presently deemed to be practical embodiments of the invention.

Example 1

A single crystal GaN of about one micron is deposited hetero-epitaxially on a single crystal sapphire substrate oriented along the hexagonal plane (0002). A polycrystalline diamond film (20 micron thick) is deposited onto the GaN layer by microwave enhanced CVD with 1% methane mixed in with hydrogen gas maintained in the reactor at 80 torr. Near the end of the CVD process, methane is replaced by silane and hydrogen is gradually terminated so the diamond film is coated with SiC and finally with Si. The multilayered film is then wafer bonded with a polysilicon wafer with the surface oxidized.

The sapphire is then split from GaN to leave the thin GaN attached on the diamond film that is in turn bonded to silicon substrate. This is an SOD substrate composite material which can be used to build a variety of devices.

Example 2

For an LED substrate, only a few layers of atoms are needed that are an extension of a silicon lattice but with about half of the atoms replaced by carbon. The following discussion provides a general guideline for one embodiment of the present invention which can be further optimized. Thoroughly clean a silicon wafer (optionally boron doped to narrow the interatomic distance and having either a 100 orientation or 111 orientation). Foreign particles may be substantially eliminated as such particles adhered on the surface may become nuclei for growing misaligned crystals. Place the wafer in a CVD reactor and heat the wafer to about 900° C. with a heater connected to the stage. Initially send in only hydrogen gas and turn on the microwave source. The atomic hydrogen will clean the wafer and etch the surface of silicon. In about half an hour, densely populated nanometer etch pits will form. Introduce 1% silane (90%)-methane (10%) mixture to the system along with the continuously flowing hydrogen. The decomposed Si and C atoms will deposit in the pits and they will be aligned by the surrounding Si lattice. Any attachment of Si or C atoms at the high point (upper-pit surface) or on the surface of the Si wafer will be gasified by hydrogen. Gradually increase methane content in the mixture of silane and methane until a 1 to 1 stoichiometric ratio is reached. The deposited atoms will have increasing carbon content so the underlying Si lattice will shrink gradually to become SiC or with Si and C approximately in equal proportion (similar to the illustration of FIG. 3A).

Optionally, $CF_4$ and/or $SiF_4$ may be intermittently introduced to replace $CH_4$ or $SiH_4$. These tetrafluorides are weakly bonded gases so they can be dissociated much easily. The fluorine atoms formed can attack loosely attached C or Si atoms on the wafer so the defects or dislocations can be eliminated intermittently (the frequency of which can be readily adjusted based on experience and/or measurements). Alternation of deposition and etching of misaligned atoms will assure that substantially only deposited atoms that are firmly attached at equilibrium lattice sites can stay. Generally, only several nanometers of chemical gradation is necessary to convert Si lattice to SiC surface with an epitaxial relationship. To prepare for the deposition of GaN, the SiC composition can be first graded to an AlN composition. This can be done by introducing $AlF_3$ and $NH_3$, again with graduation to form a chemically graded transition region. The final surface will contain AlN atoms covering at least half of the surface area. This surface area can be used as a wafer for growing GaN. Alternatively, the AlN (or GaN) substrate can be used to grow diamond. For example, a substantially single crystal diamond film can be grown using NNP (conformal coated diamond) or other suitable deposition process as described previously.

The above description and examples are intended only to illustrate certain potential embodiments of this invention. It will be readily understood by those skilled in the art that the present invention is susceptible of a broad utility and applications. Many embodiments and adaptations of the present invention other than those herein described, as well as many variations, modifications and equivalent arrangements will be apparent from or reasonably suggested by the present invention and the foregoing description thereof without departing from the substance or scope of the present invention. Accordingly, while the present invention has been described herein in detail in relation to its preferred embodiment, it is to be understood that this disclosure is only illustrative and exemplary of the present invention and is made merely for purpose of providing a full and enabling disclosure of the invention. The foregoing disclosure is not intended or to be construed to limit the present invention or otherwise to exclude any such other embodiment, adaptations, variations, modifications and equivalent arrangements, the present invention being limited only by the claims appended hereto and the equivalents thereof.

What is claimed is:

1. A method of forming a compositionally graded inorganic crystalline material, comprising the steps of:
    a) preparing a crystalline substrate by forming crystallographically oriented pits across at least a portion of an exposed surface of the substrate, wherein the exposed surface is a cubic crystal face; and
    b) depositing a transition region material on the substrate to form a transition region under epitaxial growth conditions, wherein the transition region material is epitaxially oriented by the pits such that the transition region has a compositional gradient from the crystalline substrate to a second region.

2. The method of claim 1, wherein the crystallographically oriented pits are formed by etching a (100) face of the exposed surface of the substrate sufficient to form (111) face pits on the exposed surface.

3. The method of claim 1, wherein the crystallographically oriented pits are formed by etching a (111) face of the exposed surface of the substrate sufficient to form (100) face pits on the exposed surface.

4. The method of claim 1, wherein the crystallographically oriented pits are uniformly distributed across the exposed surface.

5. The method of claim 1, wherein the epitaxial growth conditions and spacing of the crystallographically oriented pits allow crystal growth in the crystallographically oriented pits to eventually merge to form a single crystal of the transition region.

6. The method of claim 1, wherein the crystallographically oriented pits are spaced from about 20 nm to about 100 nm apart.

7. The method of claim 1, wherein the step of depositing includes cycling of at least one deposition parameter sufficient to remove defects in a crystal lattice of the transition region during growth.

8. The method of claim 7, wherein the at least one deposition parameter includes etchant concentration, source gas concentration, deposition temperature, substrate temperature, or applied bias.

9. The method of claim 8, wherein the at least one deposition parameter includes etchant concentration.

10. The method of claim 7, wherein the at least one deposition parameter includes source gas concentration such that cycling varies a destination source gas by a decrease which is less than an immediately preceding increase.

11. The method of claim 7, wherein a source gas concentration is increased substantially linearly during the step of depositing.

12. The method of claim 1, wherein the substrate is a single crystal substrate.

13. The method of claim 1, wherein the substrate consists of a member selected from the group consisting of silicon, diamond, silicon carbide, gallium nitride, and aluminum nitride.

14. The method of claim 1, wherein the second region consists of a member selected from the group consisting of silicon carbide, aluminum nitride, gallium nitride, indium nitride, cubic boron nitride, composites thereof, and combinations thereof.

15. The method of claim 1, wherein the step of preparing the substrate includes carbonizing an exposed surface of the substrate by
   a) depositing carbon at the exposed surface by either pyrolysis of a carbon-containing gas or ion implantation;
   b) heat treating the exposed surface sufficient to correct crystalline defects and to form carbide bonds between the substrate and deposited carbon to form a carbon rich substrate; and
   c) optionally removing non-carbide bonded carbon by hydrogen treatment.

16. The method of claim 1, wherein the step of preparing the substrate includes selective replacement of substrate lattice atoms with a target atom, wherein the substrate lattice atoms and target atom have sufficiently similar lattice parameters to allow substitution within a crystal lattice of the substrate without introduction of substantial lattice defects.

17. The method of claim 1, wherein the step of depositing the transition region material is a gas phase process.

18. The method of claim 1, wherein the step of depositing the transition region material is a liquid phase process.

* * * * *